United States Patent [19]
Petrosino

[11] Patent Number: 6,084,267
[45] Date of Patent: Jul. 4, 2000

[54] DESIGN PROPAGATION DELAY MEASUREMENT DEVICE

[75] Inventor: Gianluca Petrosino, Phoenix, Ariz.

[73] Assignee: STMicroelectronics, Inc., Carrollton, Tex.

[21] Appl. No.: 09/168,572

[22] Filed: Oct. 8, 1998

[51] Int. Cl.[7] .................... H01L 31/062; H01L 31/113; H01L 29/76

[52] U.S. Cl. .................... 257/341; 257/315; 257/316; 257/318; 257/320; 257/321; 438/14; 438/15; 438/16; 438/17; 438/18

[58] Field of Search .................... 257/318, 315, 257/341, 321, 316, 320; 438/14, 15, 16, 17, 18

[56] References Cited

U.S. PATENT DOCUMENTS

| | | | |
|---|---|---|---|
| 5,627,083 | 5/1997 | Tounai | 438/18 |
| 5,886,378 | 3/1999 | WAng | 257/318 |

*Primary Examiner*—Carl Whitehead, Jr.
*Assistant Examiner*—Matthew Warren
*Attorney, Agent, or Firm*—Stephen Bongini; Theodore E. Gallanthay; Lisa K. Jorgenson

[57] ABSTRACT

A semiconductor integrated circuit comprises a substrate including a plurality of transistors, and a conductive line for coupling at least two of the transistors with each other, each transistor comprising a drain diffusion region, a source diffusion region, a gate region, and a test diffusion region within the substrate, the test diffusion region being electrically coupled to a metal line within the semiconductor integrated circuit for establishing an indication of the voltage at the probing diffusion region.

18 Claims, 2 Drawing Sheets

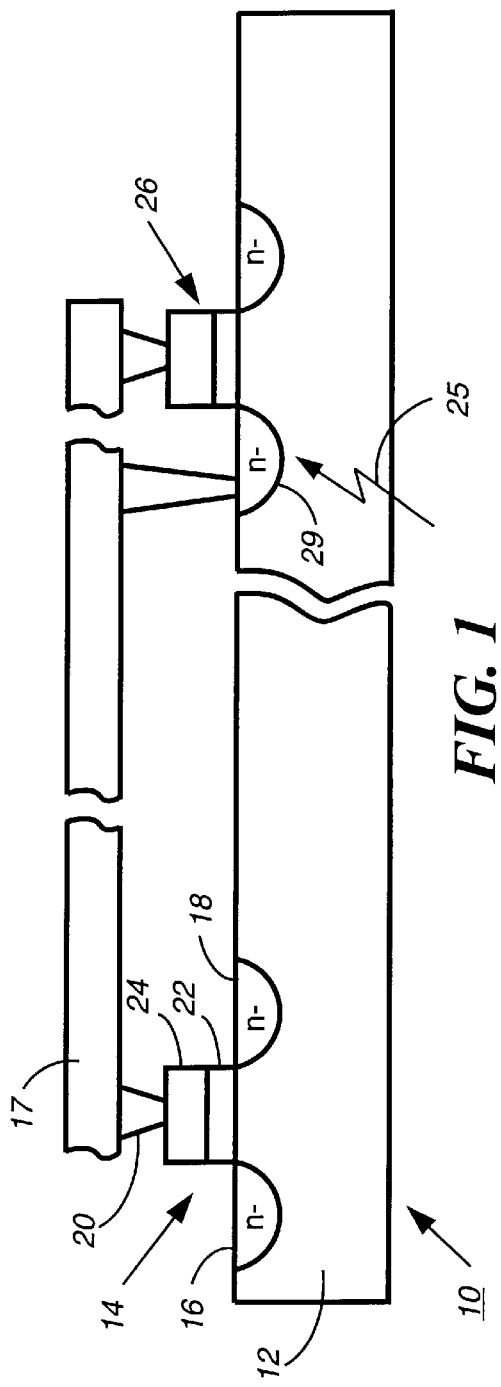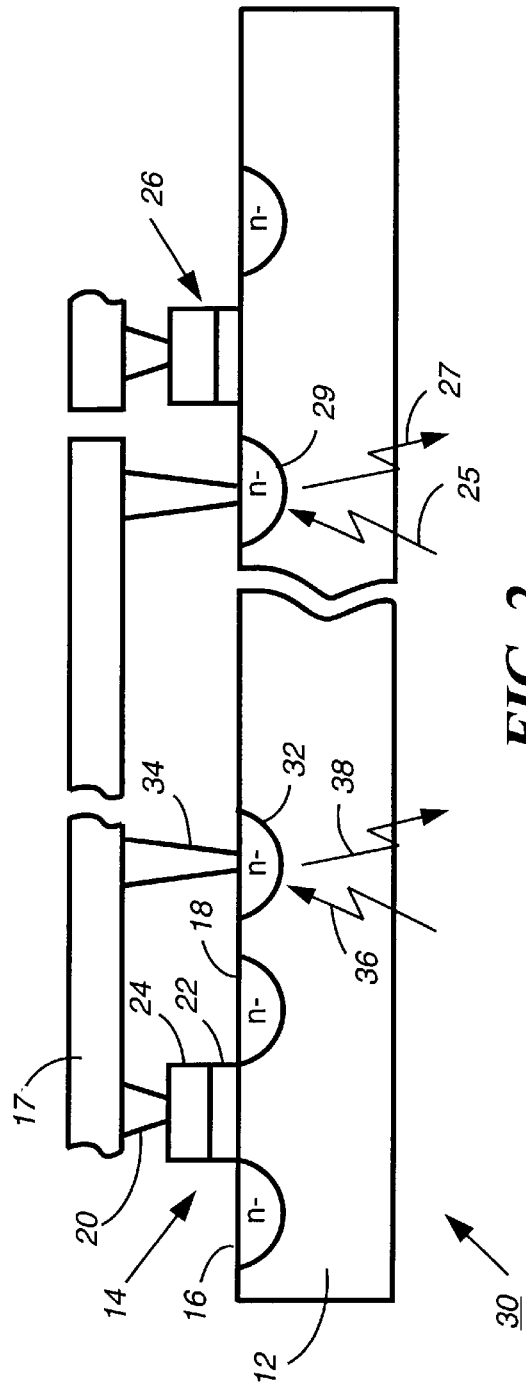

DESIGN PROPAGATION DELAY MEASUREMENT DEVICE

CROSS-REFERENCE TO RELATED APPLICATIONS

Not applicable.

BACKGROUND OF THE INVENTION

1. Field of the Invention

The invention disclosed broadly relates to the field of flip-chip devices, and more particularly relates to the field of semiconductor devices and processes for probing them.

2. Description of the Related Art

Present techniques for connecting an integrated circuit to an integrated circuit package comprise wire bond connections and flip chip connections. Wire bond connections are quite common but the flip chip approach has certain advantages. The wire bonding process comprises mounting an integrated circuit on a substrate with its inactive backside on the substrate and the active side (i.e., where the electrical contacts are) on the side of the die opposite the substrate. Wires are then bonded between the active front side of the integrated circuit and the integrated circuit package. On the other hand, flip chip techniques electrically couple the active side of a die directly to the substrate. The term "flip chip" is used because it is opposite to the traditional approach of placing the inactive backside of an integrated circuit on a substrate. That is, with a flip chip connection the active front side of an integrated circuit is placed on a substrate. An integrated circuit configured for a flip chip connection has solder bumps on wettable metal terminals. The substrate, in turn, has a matching footprint of solder wettable terminals. The solder bumps are aligned and all joints are simultaneously formed by reflowing the solder.

During manufacturing and design, it is often necessary to probe the characteristics of electrical contacts within the integrated circuits (e.g., propagation delays or connection integrity). In the case of wire-bonded designs, there is not much difficulty probing electrical contacts because the wire bonds themselves are easy to probe. There are several techniques that are known to accomplish this. One example is the use of e-beams, wherein the e-beams are directed at the IC package and reflections are measured to determine voltage levels at various points within the IC. In the case of flip-chip designs probing can be more difficult.

As the density of semiconductor devices increases there is a similar increase in the number of connections or I/O points in semiconductor devices. High-end, high pin count and high power devices are demonstrating the limitations of standard package technology, such as: (1) the difficulty to dissipate power (high-power CMOS microprocessor can dissipate as much as 30–50W), (2) the difficulty to bondwire high-pin-count (high-pin count CMOS devices can have from 400 to 800 pins), and (3) the difficulty to meet the speed specifications (flip-chip packages permit up to 15 MHz speed improvement with respect to standard wirebond packages). Thus, the continuously increasing complexity of semiconductor devices is leading to the flip-chip device solution to permit higher pin counts, better power dissipation and higher speed performance due to the lack of bonding wires and capacitance reduction. However, as mentioned above, flip-chip technology creates significant problems in the design analysis phase because there is no longer a capability to acquire waveforms by e-beam methods since the certain metal levels are not accessible. Similar problems associated with use of the flip-chip approach include impossibility to repair and/or correct defects on a single chip. New leading probing technologies (back probing) provide partial solutions for design analysis evaluation but by themselves are not enough to provide the required full design analysis of traditional e-beams methods. Therefore, flip-chip technology is taking place for what is concerning cutting edge technology for semiconductor IC.

However, the characteristics of flip-chips are also the source of some problems. To begin, the top surface of the chip is not accessible from the exterior because it is "soldered" to the package substrate. Only the back of the die (silicon substrate) is visible and accessible for any kind of measurements.

At this point conventional probing techniques, as e-beam and microprobing are not possible any more. In fact these techniques are based on their popularity in the capability to measure voltage values on the metal interconnection. For flip-chip packages this is not possible anymore.

Thus, backprobing technology was developed and presently these systems are basing their capability to probe waveforms internally to the chip using the so-called LVP (laser voltage probing) technology. A laser beam hitting the silicon substrate of the chip (as thinned and coated) and the transistors' junctions. The reflected laser beam is modified by voltage waveform on the junction by this laser beam perturbation. However, some areas in the package under the flip-chip die are still obscured and hence cannot be probed. Therefore, a solution for the above mentioned problem is required.

SUMMARY OF THE INVENTION

A semiconductor integrated circuit comprises a region of a first conductivity type; a conducting line; and a first electronic device. The first electronic device comprises a control electrode connected to the region of the first conductivity type; and first, second, and third diffusion regions of a second conductivity type formed within the region of the first conductivity type. The third region is connected to the conducting line and the first and second diffusion regions of the second conductivity type are each coupled to the control electrode such that a signal at the control electrode enables a current flow between the first and second diffusion regions of the second conductivity type.

BRIEF DESCRIPTION OF THE DRAWINGS

FIG. 1 is an illustration of a flip chip structure known in the art.

FIG. 2 is an illustration of a flip chip structure including an additional diffusion region according to the present invention.

DETAILED DESCRIPTION OF AN EMBODIMENT

Figure 3:
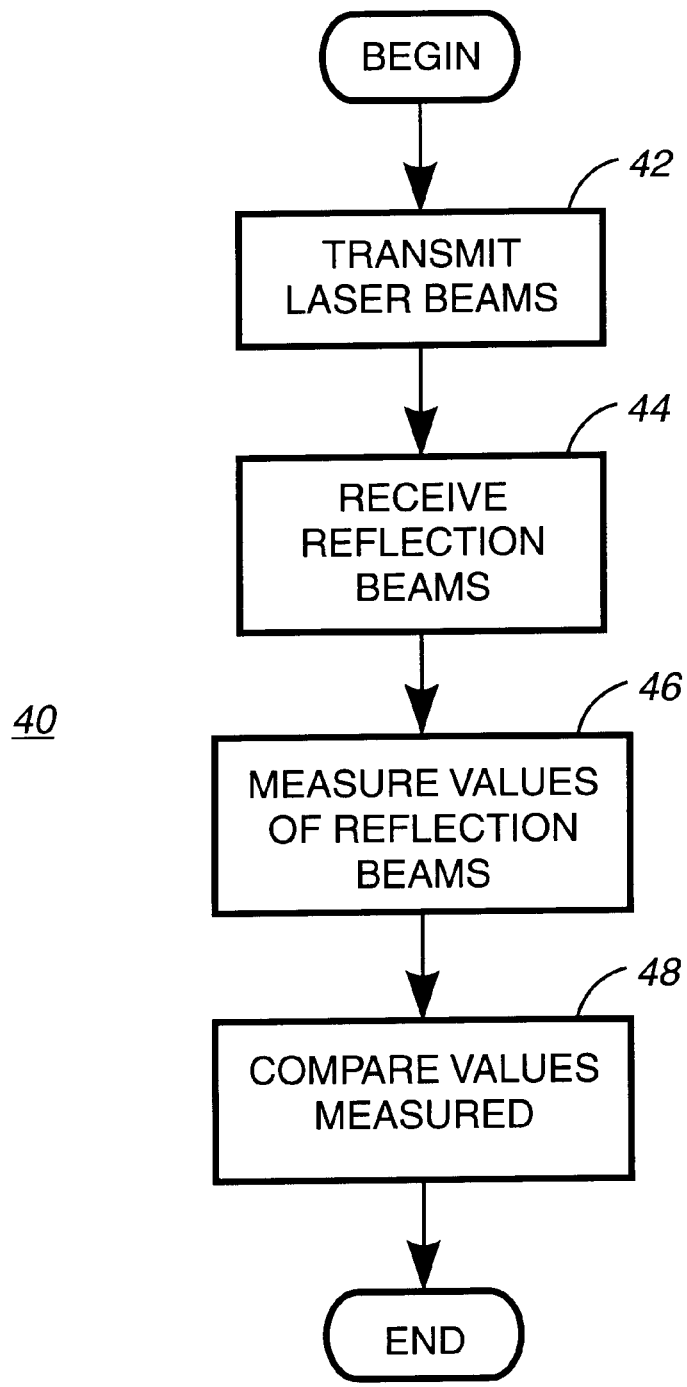
FIG. 3 is a flow chart of a method according to the invention.

Referring to FIG. 1, there is shown an illustration of a flip chip structure 10 known in the art. The device 10 comprises a region 12 comprising a p-type semiconductor material (preferably Silicon). Within the p-type region 12, a transistor is formed comprising an n-type diffusion region 16 (the drain) and a second n-type region 18 (the source). The transistor 14 further comprises a gate which includes a polysilicon layer 24 and a gate oxide layer 22. The polysilicon layer 24 is connected directly to a long metal line 17 by means of a conductive contact 20. The integrated circuit 10 includes many other transistors or other electronic devices such as transistor 26.

In a flip-chip configuration the side of the integrated circuit 10 including the line 17 is connected directly on a substrate such that many n-type diffusion regions close to contact 20 cannot be effectively probed using existing techniques for reasons discussed in the Background. Thus a laser beam 25 directed at region 29 would acquire a signal at that point (possibly the source of the signal) but since region 16 which is close to the contact 20 is not connected to any n-type region, there is no way to acquire the signal at the transistor's gate 24. To provide capability to perform a measurement at transistor's gate 24 an n-p junction close to the transistor gate can be implemented according to the invention.

Referring to FIG. 2, a structure similar to that of FIG. 1 includes an additional n-type diffusion region 32 which is connected to the line 17 by means of a contact 34. A non-contact (optical) probing technique (e.g., that described in "A Noninvasive Optical Probe for Detecting Electrical Signals In Silicon Integrated Circuits" by Harley K. Heinrich) can be used to probe the metal line 17 by capturing a signal at region 32 that is indicative the propagation of signals not previously accessible by conventional probing techniques. The region 32 is called a dummy test (or probing) region herein because it distinguishable from other n-type diffusions, such as region 29 in that it does not form a part of a transistor (i.e., it is not connected as a drain, source, or gate thereof). This new structure basically permits the waveform acquisition both at the generating point and at the ending side of a long interconnection. This is accomplished by the transmission of a laser beam 36 at the test region 32 and a beam 25 at region 29. A reflection beam 27 captures the signal at region 29 and reflection beam 38, at region 32. A comparison of these reflections can be used to make certain measurements such as continuity and propagation delay along line 17. By comparison with FIG. 1, it can be appreciated that laser beams in the direction of beam 36 would not necessarily reach line 17 near region 32 not because intervening layers or metalizations could obscure portions of metal line 17 near transistor 14. Region 32 is preferably located at a minimum rule distance from region 18.

The invention applies in all the cases where it is necessary to evaluate the propagation delay of a long interconnection. Another frequent case where the invention may be used is in cases wherein it is necessary to to evaluate if an internal line is for whatever reason interrupted (e.g., open contacts or defective metal). In this a case back probing solution, which is supposed to probe only transistor junctions, does not permit performance of this evaluation unless using this technique.

Because of such kind of n-p junction does not requiring a large amount of area under the metal 17, this capability can be extended for all n and p type transistors in the circuit 10. This is made particularly easy in the case of standard cell blocks wherein it is possible to define the additional p-n junction at the standard cell definition time. The invention is also applicable to other types of transistors and other types of devices near unaccessible contact areas.

Referring to FIG. 3, there is shown a flowchart of a method for probing semiconductor devices in accordance with the invention. The method 40 begins and at step 42 a first laser beam 25 is transmitted by a probing device at the test diffusion region 29 (shown in FIG. 2) and a second laser beam is transmitted at a dummy test region 32. These transmissions are not done simultaneously but rather at different times. In step 44 a probing device receives a first reflection beam 27 from the test diffusion region 29 and a second reflection beam 38 from the dummy test region 32. In step 46, there are measured a value for a parameter for a signal passing through the conductive line 17 at point 33 and a value for the parameter of the signal as it passes through point 20. Although where there is a discontinuity in the line 17 the value at the ending point 20 may be zero. This value can be a voltage level, signal phase, or other parameter relating to the signal passing through points 33 to 20. It should be noted that it is also possible to measure reflections from two dummy test regions (i.e., neither is an electrode of a transistor or other device). In step 48 a comparison is made for the value for the parameter measured at the dummy test region 32 and at the second test region 29 with the value for the parameter measured at the second point. The comparison provides information relating to the connection between the points probed.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A semiconductor integrated circuit comprising:
   a region of a first conductivity type;
   a conducting line; and
   a first electronic device comprising:
      a control electrode above the region of the first conductivity type; and
      first, second, and third diffusion regions of a second conductivity type formed within the region of the first conductivity type,
   wherein both the third diffusion region and the control electrode are directly electrically connected to the conducting line, and
   a signal of at least a predetermined voltage at the control electrode enables a current flow between the first and second diffusion regions of the second conductivity type.

2. The semiconductor integrated circuit of claim 1 wherein the control electrode is a gate and the first and second regions of the second conductivity type are a source and drain, respectively.

3. The semiconductor integrated circuit of claim 2 wherein the drain and source diffusion regions are n-type and these diffusion regions are formed in a p-type substrate.

4. The semiconductor integrated circuit of claim 2 wherein the drain and source diffusion regions are p-type and these diffusion regions are formed in an n-type substrate.

5. The semiconductor integrated circuit of claim 1 further comprising a second device comprising a diffusion region of the second conductivity type connected directly to the conducting line.

6. The semiconductor integrated circuit of claim 1, wherein the second diffusion region is adjacent to the third diffusion region, and no gate electrode is above the region of the first conductivity type between the second and third diffusion regions.

7. The semiconductor integrated circuit of claim 1, wherein the second diffusion region is adjacent to the third diffusion region, and the second and third diffusion regions do not form the drain and source regions of a transistor.

8. A semiconductor integrated circuit comprising:

a substrate comprising a plurality of transistors; and a conductive line for coupling at least two of the transistors with each other, wherein at least one of the two transistors includes a drain diffusion region, a source diffusion region, a channel region, and a test diffusion region within the substrate, the test diffusion region being electrically connected to the conductive line to allow a determination of the voltage on the conductive line in the vicinity of the test diffusion region.

9. The semiconductor integrated circuit of claim 8 wherein the source diffusion region is adjacent to the test diffusion region, and there is no channel region within the substrate between the source and test diffusion regions.

10. The semiconductor integrated circuit of claim 8 wherein the drain diffusion region is adjacent to the test diffusion region, and there is no channel region within the substrate between the drain and test diffusion regions.

11. The semiconductor integrated circuit of claim 8 wherein a separate transistor is not formed by the test diffusion region and either the drain or source diffusion regions.

12. A method for testing a semiconductor integrated circuit comprising a plurality of semiconductor devices, at least one of which includes two diffusion regions and a third test diffusion region, the test diffusion region being directly electrically connected to a conductive line within the integrated circuit, the method comprising the steps of:

transmitting a first laser beam at a first diffusion region connected to a first point on the conductive line and a second laser beam at the test diffusion region of the one semiconductor device, the test diffusion region being connected to the conductive line at a distance from the first point;

receiving a first reflection beam from the first diffusion region and a second reflection beam from the test diffusion region; and measuring a value for a parameter for a signal passing through the conductive line at the first diffusion region and a second value for the signal passing through the conductive line at the test diffusion region.

13. The method of claim 12 further comprising the step of:

comparing the value for the parameter measured at the first diffusion region with the value for the parameter measured at the test diffusion region.

14. The method of claim 12 wherein the parameter is signal strength.

15. The method of claim 12 wherein the parameter is line delay.

16. The method of claim 13 wherein the parameter is signal strength.

17. The method of claim 13 wherein the parameter is line delay.

18. The method of claim 13 wherein the parameter is continuity of the conductive line.

* * * * *